United States Patent [19]

Powell et al.

[11] Patent Number: 4,764,026
[45] Date of Patent: Aug. 16, 1988

[54] SEMICONDUCTOR WAFER TEMPERATURE MEASURING DEVICE AND METHOD

[75] Inventors: Ronald A. Powell, Redwood City; Susan B. Felch, Los Altos, both of Calif.

[73] Assignee: Varian Associates, Inc., Palo Alto, Calif.

[21] Appl. No.: 882,798

[22] Filed: Jul. 7, 1986

[51] Int. Cl.[4] .............................................. G01K 7/00
[52] U.S. Cl. ......................................... 374/178; 374/7
[58] Field of Search ........................... 374/185, 178, 7

[56] References Cited

U.S. PATENT DOCUMENTS

| | | | |
|---|---|---|---|
| 2,871,330 | 1/1959 | Collins | 374/185 |
| 3,412,610 | 11/1968 | Prussin | 374/185 |
| 3,644,863 | 2/1972 | Tsuei | 374/185 |
| 3,923,563 | 12/1975 | Venkatu | 252/951 |
| 3,988,181 | 10/1976 | Imai et al. | 148/188 |
| 4,198,676 | 4/1980 | Varnum et al. | 374/185 |
| 4,200,970 | 5/1980 | Schonberger | 338/22 SD |
| 4,391,846 | 7/1983 | Raymond | 427/99 |
| 4,467,519 | 8/1984 | Glane et al. | 357/34 |
| 4,679,946 | 7/1987 | Rosencwaig et al. | 374/7 |

OTHER PUBLICATIONS

Schurman, Josef "Sensoren Für die Automobil-Elektronik", Funkschau, 1978, Heft 14 pp. 679–682.

Primary Examiner—William A. Cuchlinski, Jr.
Assistant Examiner—Thomas B. Will
Attorney, Agent, or Firm—Stanley Z. Cole; Kenneth L. Warsh; Gerald M. Fisher

[57] ABSTRACT

A probe having four spring-loaded tips contacts the backside of a semiconductor wafer in a processing machine. A current is induced across the outer tips and a voltage proportional to the sheet resistance of the wafer is measured across the inner tips. Wafer thickness is used to convert sheet resistance to bulk resistivity. Data on resistivity as a function of temperature is used to determine wafer temperature.

8 Claims, 3 Drawing Sheets

4,764,026

SEMICONDUCTOR WAFER TEMPERATURE MEASURING DEVICE AND METHOD

FIELD OF THE INVENTION

This invention pertains to a device for measuring the temperature of a semiconductor wafer in situ in a processing machine.

BACKGROUND OF THE INVENTION

Three principal methods have been used to measure the temperature of semiconductor wafers during thermal processing: (1) radiation pyrometers (optical or infrared), (2) fluoroptic probes, and (3) thermocouples.

For low wafer temperature (about 300° C.), radiation pyrometry is difficult to apply, since the total blackbody radiation intensity (proportional to $T^4$) is weak. Complicating the measurement at higher temperatures is the fact that the emissivity of silicon changes rapidly with temperature in the range of about 300°–600° C. for wavelengths from about 1.1 microns (the silicon bandgap) to 5 microns (the range where the blackbody radiation is most intense and where many radiation pyrometers operate). Also, since bare silicon is partially transparent to infrared radiation for temperatures up to 600° C., one must discriminate blackbody radiation produced by the heated wafer from radiation coming from other heated surfaces and passing through it. Similarly, background radiation detected from filaments, heaters, etc. located in the vicinity of the pyrometer must be taken into account.

Fluoroptic methods take advantage of the temperature-dependent fluorescence spectrum which certain materials exhibit. At present, however, the fluoroptic method cannot be used to measure wafer temperature greater than about 400° C., due to the lack of sensitivity of the phosphors currently employed. Hence, the technique is not suitable for important processes such as the sputter deposition of aluminum where substrate temperatures greater than 450° C. are often employed.

As a practical matter, accurate thermocouple measurements of wafer temperature are very difficult to make, due to the problem of making good, non-destructive thermal contact to the wafer. This is particularly difficult in vacuum ambients. Often, the temperature of a substrate holder or heater assumed to be in thermal equilibrium with the substrate is measured by the thermocouple, instead of the wafer temperature. In cases where wafer temperature is changing quickly, this assumption will generally not hold. In addition, mechanical integrity of the thermocouple can be a problem since the thermal mass of its bead and wires must be kept as small as possible in order to obtain fast response time and to avoid heat sinking the wafer and thereby perturbing its temperature by the measurement process.

OBJECTS OF THE INVENTION

An object of the invention is to provide a device for accurately measuring the temperature of a semiconductor wafer while it is being processed.

Another object is to provide a device which can perform such a measurement without interfering with the processing of the face of the wafer.

SUMMARY OF THE INVENTION

These objects of the invention and other objects, features and advantages to become apparent as the specification progresses are accomplished by the invention according to which, briefly stated, the temperature is measured by measuring the sheet resistance at the back of the wafer and computing the temperature from a known relationship.

This invention allows one to determine the temperature of a silicon wafer by means of a simple, pressure-probe contact measurement of the wafer's electrical sheet resistance. The measurement is rapid (<10 sec) and nondestructive, is highly sensitive to temperature variation (@500° C., ±5° C. or better can be detected), can be made in either atmospheric or vacuum ambients, and is particularly well suited for substrate temperatures in the range of approximately 200°–600° C., i.e., temperatures encountered in such IC processing steps as the sputter-deposition of aluminum alloy films, sintering of aluminum ohmic contacts to silicon, and chemical vapor deposition of refractory metals and metal silicides. The invention is intended to be used in real time on wafers undergoing such processing. Knowledge of the wafer time-temperature profile allows one to monitor and control a process step or characterize the performance and reproducibility of processing equipment.

These and further constructional and operational characteristics of the invention will be more evident from the detailed description given hereinafter with reference to the figures of the accompanying drawings which illustrate one preferred embodiment and alternatives by way of non-limiting examples.

GLOSSARY

The following is a glossary of terms, elements and structural members as referenced and employed in the present invention.

10—probe
12—wafer
14—outer tips
16—current source
18—inner tips
20—voltage measuring device
22—hole in lower guide plate
24—hole in upper guide plate
26—lower guide plate
28—upper guide plate
30—body
32—electrical lead
34—spring
36—spring block
38—tension adjustment screw

DETAILED DESCRIPTION OF THE PREFERRED EMBODIMENTS

Microelectronic device fabrication takes place, for the most part, in a very thin surface layer (1–5 microns thick) on a much thicker (500–700 microns thick) bulk silicon substrate. For sufficiently high temperatures, the electrical resistivity of this substrate changes with temperature and is independent of bulk substrate doping concentration or dopant species. A pressure-contact four-point probe, while designed for room-temperature application, can be used at elevated temperatures to make highly accurate, nondestructive measurements of substrate resistivity, provided suitable materials are used in its construction (e.g., avoid low-melting-point plastics, use refractory metal probe tips). In addition, as will be discussed below, such a probe has a dynamic range suitable for measuring substrate temperatures in the range of room temperature to greater than about 1000° C.

Figure 1:
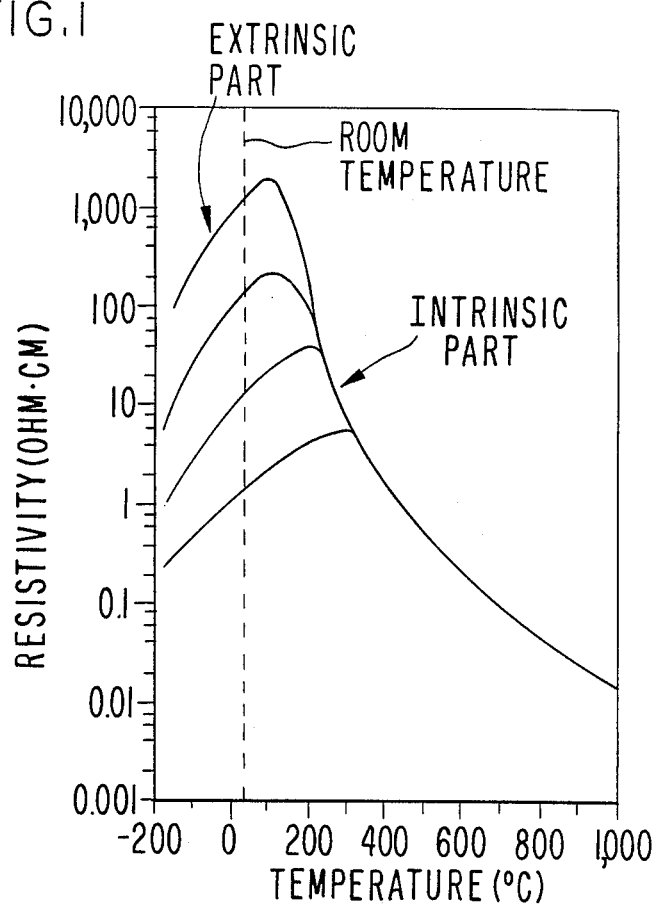
FIG. 1 shows a graph of resistivity versus temperature of a silicon wafer at different levels of boron doping from $10^{13}$ to $10^{16}$ per cc.

The variation of silicon resistivity with temperature depends on variations in both carrier concentration and carrier mobility; carriers result from intentional substrate doping (extrinsic conduction) or from electron-hole pairs produced by thermal excitation of carriers across the silicon bandgap (intrinsic conduction). FIG. 1 indicates schematically how one expects the resistivity r (in ohm-cm) of a silicon substrate to vary with temperature. P-type (boron) substrate dopings of $10^{13}$ to $10^{16}$ per cc are assumed. At or near room temperature, the shallow boron acceptor levels are fully ionized, so that changes in carrier (hole) concentration with temperature are insignificant. Instead, resistivity r increases with temperature, reflecting a similar decrease in mobility from lattice scattering. At sufficiently high temperatures, however, the curve peaks and decreases sharply, reflecting the onset of intrinsic carrier production. Similar curves are predicted for n-type doping. Regardless of doping concentration or dopant species, the resistivity curves converge to the same intrinsic carrier curve.

We postulate that for the thickness of 4–6" diameter silicon wafers commonly employed in IC processing (about 500–700 microns), the enormous $10^5$-fold variation in sheet resistance (in ohms/sq) expected in going from room temperature to 1000° C. (40,000 to 0.4 ohms/sq) is measureable with a simple four-point probe.

On the intrinsic part of the curve, a 10% change in resistivity r (easily sensed with a four-point probe) corresponds to a very small 5°–10° C. change in substrate temperature. In the region of intrinsic conduction, resistivity depends exponentially on temperature T, viz. resistivity r is proportional to exp $(E_g/kT)$, where $E_g$ (approximately 1.1 eV) is the silicon bandgap and k (approximately $8.7 \times 10^{-5}$ eV/°K.) is Boltzman's constant. (We have ignored as second order the dependence of bandgap on T.) Hence, the fractional change in resistivity is $dr/r = -E_g dT/2kT^2$. At 500° C. (773° K.), we have $dr/r = -8.2\ dT/T$, so that a 5° C. increase in T corresponds to a 8.2% decrease in r which should be easily detectable.

Our discovery that percentage changes in temperature are reflected and amplified nearly 10-fold in percentage changes in intrinsic resistivity is an important part of the present disclosure. The above observations indicate that a four-point probe measurement will be applicable to a range of substrate dopings and substrate temperatures widely encountered in silicon IC processing, and that highly accurate ($<\pm5°$ C.) temperature determination is possible. Also, to maintain this sensitivity over the widest temperature range, high resistivity substrates are desired so that one remains on the steep intrinsic part of the curve. For example, a $10^{13}$ per cc p- or n-doped substrate (room temperature resistivity of approximately 300 ohm-cm) falls on the intrinsic part of the r-T curve for T greater than about 100° C. At higher doping levels, substrate polarity will be a factor. For example, at $10^{15}$ per cc, a p-type substrate is a better choice in this regard, since its resistivity is decreasing steeply by 200° C. as compared to 300° C. for an n-type substrate. In general, of course, the bulk doping of a device wafer could be much greater that $10^{15}$ per cc, and this would affect one's ability to measure small ($\pm5°$ C.) changes in temperature with the present technique. Fortunately, standard Si(100) substrates used in CMOS applications usually have resistivities of about 1–10 ohm-cm, corresponding to doping levels of about $5 \times 10^{14-15}$ per cc (n-type) and about $10^{15}$–$10^{16}$ per cc (p-type).

The invention consists, basically, of a four-point probe with pressure-contact tips that can be brought into electrical contact with a stationary wafer for a current/voltage measurement of substrate sheet resistance, $R_s = r/t$. Independent knowledge of wafer thickness (t) allows the resistivity to be calculated and temperature determined. Alternately, if sheet resistance is measured with the wafer at an independently-determined temperature on the intrinsic part of the resistivity-temperature curve, then a thickness is not required. Since the wafer temperature is determined by its bulk electrical resistivity, spurious sources of heat or radiation do not have to be considered. Similarly, changes in wafer emissivity or other optical properties do not have to be taken into account. The current/voltage tips of the four-point probe may be arranged in a line or in some other configuration (e.g., a square). Because of the high spatial resolution of the probe (less than about $5 \times 5$ mm$^2$), one can measure the spatial variation of temperature across the wafer, e.g., center to edge variation, if desired.

Figure 2:
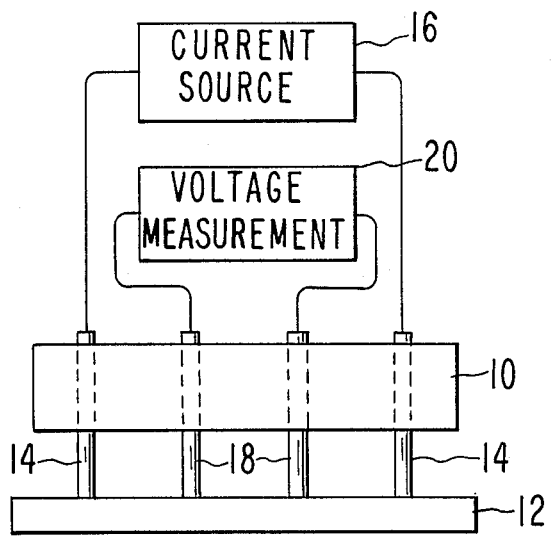
FIG. 2 is a schematic of the system according to the invention.

Referring now to the drawings wherein reference numerals are used to designate parts throughout the various figures thereof, there is shown in FIG. 2 the measurement system according to the invention. A probe 10 has four tips in contact with the silicon wafer 12. The two outer tips 14 are connected to a source of current 16. The two inner tips 18 are connected to a voltage measuring device 20.

Figure 3:
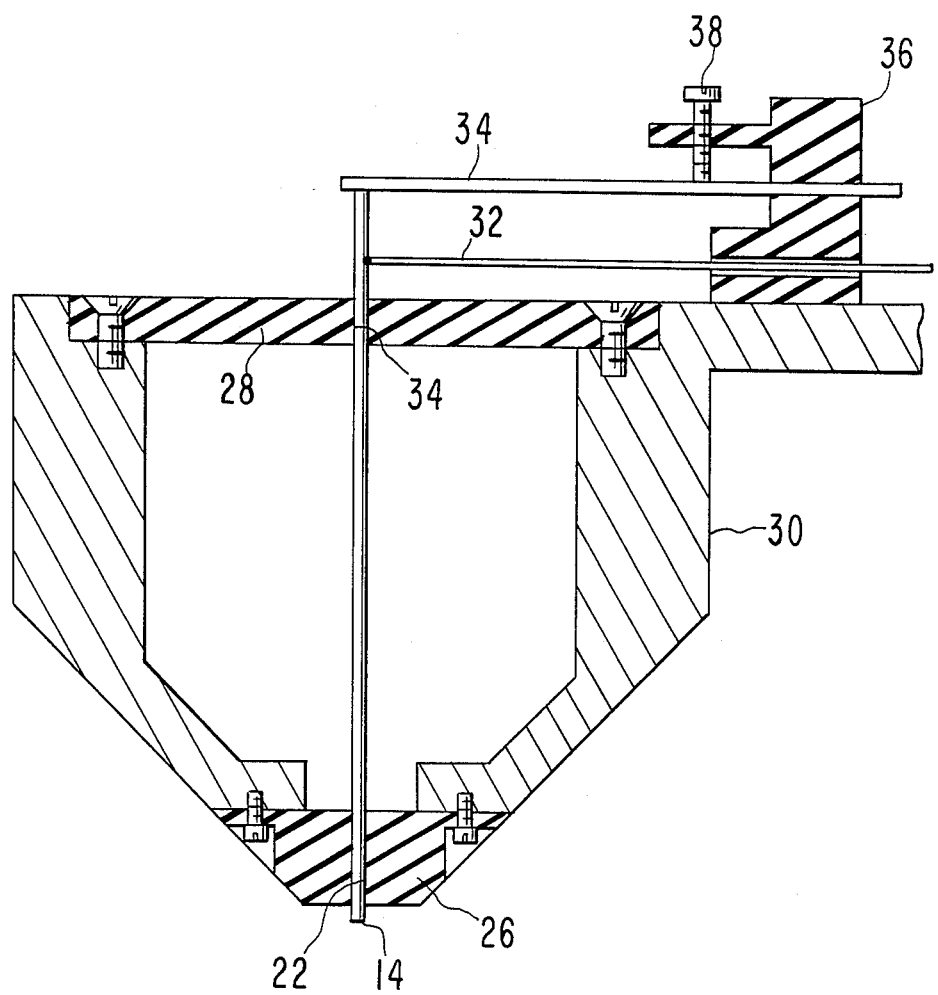
FIG. 3 is a cross-section of the probe of the system of FIG. 2.

The construction of the probe is shown in cross-sectional view in FIG. 3 with one tip shown for simplicity. The other tips are in line behind the one shown.

The tip 14 is slidably supported in holes 22 and 24 in lower guide plate 26 and upper guide plate 28. The guide plates 26 and 28 are mounted to a body 30 which is fastened to the processing machine (not shown). The body 30 may be made of metal, but the guide plates 26 and 28 must be made of non-electrically conductive material such as ceramic in order to insulate the tip 14 from the body and from the other tips (not shown in FIG. 3). The tip 14 is attached to electrical lead 32 which is connected to the current source 16. The inside end of the tip 14 abuts a spring 34 which is mounted to a spring block 36 which must be made of non-electrically conducting material or otherwise electrically isolated. Tension adjustment screw 38 is used to adjust the tension of the spring. The tips 14 and 18 may be made of tungsten carbide, osmium or other refractory materials.

While the measurement could be made from front or back side, the back side is preferred since this avoids any physical contact with devices on the front surface and allows front side processes such as sputter deposition or dry etching to be performed simultaneously with the four-point probe measurement. Since the contact probe pressure can be made very small, mechanical damage is insignificant compared to usual backside lapping damage. The wafer is assumed to be a bare silicon wafer (test wafer) or a device wafer whose back surface allows the silicon substrate to be directly probed. Device wafers with very thick dielectric layers or metallic layers covering their back surface cannot be probed without a suitable contact via first being etched down to the silicon substrate. It is possible, however, to probe through thin oxides and nitrides if the probe pressure is sufficiently high. The four-point probe may be left in place during processing or briefly brought into contact and removed. The point contact nature of the probe tips presents a very low thermal conductivity path and therefore doesn't perturb the wafer temperature.

A 150 mm diameter silicon wafer was broken to obtain several pieces and then chemically thinned by different amounts in a $HNO_3$ and HF solution. The thinned pieces thus had the same doping but thicknesses varying from 350 micrometers to 700 micrometers. The sheet resistance $R_s$ as a function of temperature was measured for four different pieces. The curves of sheet resistance as a function of temperature had the same slope for all four pieces for temperatures above 200° C. Therefore a single wafer calibration is sufficient to give the curve of sheet resistance vs. temperature for a wafer of any thickness as long as the thickness of that wafer is measured directly. A cassette of wafers in commercial production typically has a thickness variation of ±5 micrometers. Therefore it would be necessary to measure the thickness of only one wafer in every cassette unless an extremely accurate temperature measurement was desired.

The sheet resistance of a silicon wafer with 0.09 micrometers thermal $SiO_2$ on the front and back was measured at several temperatures. The oxide was then removed, and the sheet resistance remeasured. At each temperature the two measurements were the same within the experimental uncertainty. Thus the probe pressure is sufficient to punch through a 0.09 micrometer oxide layer and contact the silicon underneath, allowing one to measure its sheet resistance.

A material which exhibits an appropriate temperature-dependent resistivity (e.g., doped or undoped polysilicon grown by LPCVD or sputtered carbon) could be deposited on the wafer back surface for subsequent sheet resistance measurements. Such materials may exhibit a resistivity which is even more sensitive to temperature variation than does monocrystal Si. Alternately, this could be an attractive way to extend the present disclosure to GaAs substrates which, unless heavily doped, do not make an ohmic contact with a pressure probe and whose large bandgap results in the onset of significant intrinsic conduction at much higher temperatures than in silicon.

Figure 4:
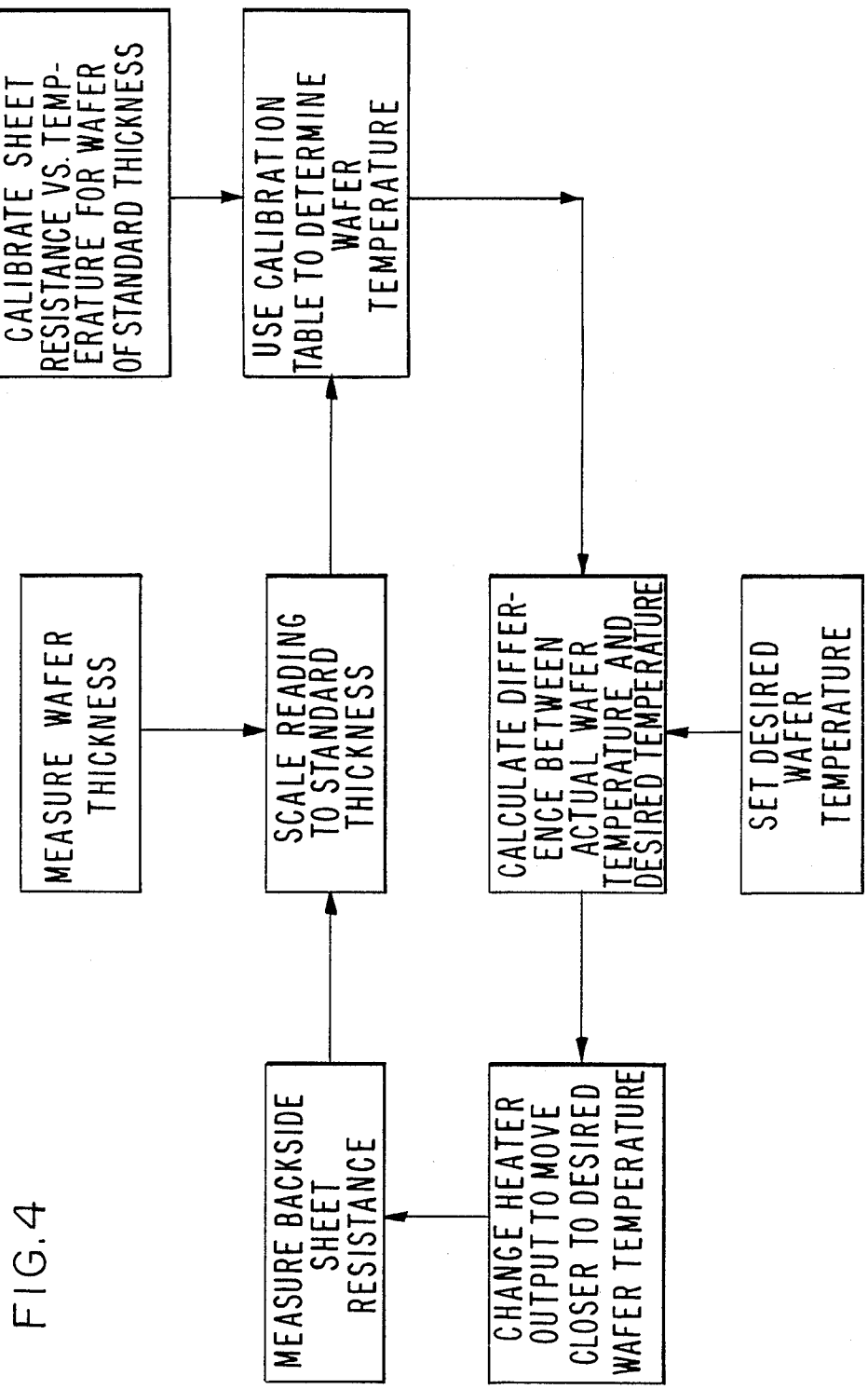
FIG. 4 is a flow diagram of the method of operating the system of the invention.

Referring now to FIG. 4 in which a flow diagram illustrates the method of using the invention, there is shown the method of measuring temperature of the wafer using a direct measurement of the thickness of one wafer of the cassette. (1) The calibration tables of sheet resistance versus temperature for various standard thicknesses are stored in the computer. (2) The desired wafer temperature is stored in the computer. (3) The wafer thickness is measured and stored in the computer. (4) The backside sheet resistance is measured and stored in the computer. (5) The computer is used to scale the measured wafer thickness to the nearest standard thickness by linear interpolation. (6) The computer is used to compare the sheet resistance measurement to the calibration table to obtain temperature. (7) The computer is used to compute the difference between the measured temperature and the desired temperature. (8) The wafer heating means is controlled by the computer in response to the temperature difference computations.

This invention is not limited to the preferred embodiment and alternatives heretofore described, to which variations and improvements may be made including mechanically and electrically equivalent modifications to component parts, without departing from the scope of protection of the present patent and true spirit of the invention, the characteristics of which are summarized in the following claims.

What is claimed is:

1. Apparatus for measuring an elevated temperature of a semiconductor wafer in situ in a wafer processing machine comprising:
   measurement means for measuring a sheet resistance of the wafer at temperatures in excess of a temperature corresponding to a maximum resistivity on a curve of resistivity versus temperature;
   computer means for storing a measurement of a wafer thickness for said wafer;
   data processing means for storing information from said measurement means in said computer means; and
   said computer means including means for calculating resistivity from the sheet resistance and the wafer thickness, said computer means including means for computing said elevated temperature from the resistivity.

2. The apparatus of claim 1 in which said measurement means include a four-point probe means for measuring the sheet resistance having four points.

3. The apparatus of claim 2 in which said four-point probe means includes tips of refractory metal.

4. The apparatus of claim 3 in which said four-point probe means contacts a back of the wafer.

5. The apparatus of claim 4 in which the four points of said four-point probe means are arranged evenly spaced in a linear array.

6. A method of measuring an elevated temperature of a semiconductor wafer in situ in a wafer processing machine comprising the steps of:
   measuring a thickness of the wafer;
   measuring a sheet resistance of the wafer at temperatures in excess of a temperature corresponding to a maximum resistivity on a curve of resistivity versus temperature;
   calculating a resistivity of the wafer from the sheet resistance and the wafer thickness; and
   calculating said elevated temperature of the wafer from the resistivity.

7. The method of claim 6 wherein the step of measuring sheet resistance is made at the back of the wafer.

8. The method of claim 7 wherein the step of measuring sheet resistance is made with a four-point probe.

* * * * *